(12) United States Patent
Moroney et al.

(10) Patent No.: US 11,510,347 B2
(45) Date of Patent: Nov. 22, 2022

(54) EMP-RESISTANT SATELLITE COMMUNICATIONS WITH SIGNAL REGENERATING SYSTEM AND METHOD

(71) Applicant: John Moroney, Jupiter, FL (US)

(72) Inventors: John Moroney, Jupiter, FL (US); George A. Livergood, Rogers, AR (US)

(73) Assignee: John Moroney, Jupiter, FL (US)

( * ) Notice: Subject to any disclaimer, the term of this patent is extended or adjusted under 35 U.S.C. 154(b) by 0 days.

(21) Appl. No.: 17/722,140

(22) Filed: Apr. 15, 2022

(65) Prior Publication Data

US 2022/0248574 A1 Aug. 4, 2022

Related U.S. Application Data

(63) Continuation-in-part of application No. 17/544,662, filed on Dec. 7, 2021, which is a continuation-in-part
(Continued)

(51) Int. Cl.
*H04B 7/15* (2006.01)
*H01Q 3/00* (2006.01)
(Continued)

(52) U.S. Cl.
CPC .............. *H05K 9/0007* (2013.01); *H01Q 3/02* (2013.01); *H02J 9/06* (2013.01); *H04B 7/18515* (2013.01); *H04B 7/18528* (2013.01)

(58) Field of Classification Search
CPC ...... H04B 7/15; H04B 7/155; H04B 7/18515; H01Q 1/125; H01Q 1/32; H01Q 3/00;
(Continued)

(56) References Cited

U.S. PATENT DOCUMENTS 5,717,576 A 2/1998 Van Doeselaar
6,597,255 B1 9/2003 Turton
(Continued)

OTHER PUBLICATIONS

"International Search Report, PCT/US2019/064732".

*Primary Examiner* — Blane J Jackson
(74) *Attorney, Agent, or Firm* — Law Office of Mark Brown, LLC; Mark E. Brown

(57) ABSTRACT

An electromagnetic pulse (EMP) resistant telecommunications (telecom) system includes core components mounted within and shielded by a Faraday cage. The components include a data source or storage device. An ethernet switch selectively connects the data source or storage device to a primary satellite router and a post-EMP satellite router. Telecom signals are output from and input to the core components via low noise blocks (LNBs) and block upconverters (BUCs). A method of resisting EMP interference for a telecommunications system includes the steps of enclosing and shielding core components in a Faraday cage and providing output via LNBs and BUCs to an antenna subsystem. The antenna subsystem can include one or more antenna elements with configurations chosen from the group comprising: parabolic dish; array; unidirectional; and omnidirectional. The EMP-resistant telecom can optionally be combined with a signal regenerating subsystem and used with a signal regenerating method.

11 Claims, 4 Drawing Sheets

Related U.S. Application Data of application No. 16/704,651, filed on Dec. 5, 2019, now Pat. No. 11,196,481.

(60) Provisional application No. 63/192,410, filed on May 24, 2021, provisional application No. 62/775,456, filed on Dec. 5, 2018.

(51) Int. Cl.
| | |
|---|---|
| *H05K 9/00* | (2006.01) |
| *H04B 1/40* | (2015.01) |
| *H04B 7/185* | (2006.01) |
| *H02J 9/06* | (2006.01) |
| *H01Q 3/02* | (2006.01) |

(58) Field of Classification Search
CPC .... H01Q 21/0006; H05K 9/00; H05K 9/0007; H05K 9/006
See application file for complete search history.

(56) References Cited

U.S. PATENT DOCUMENTS

| | | |
|---|---|---|
| 6,822,876 B2 | 11/2004 | Goergen |
| 8,219,799 B1 | 7/2012 | Lucchesi |
| 9,100,361 B1 | 8/2015 | Lucchesi |
| 2011/0280178 A1 | 11/2011 | Heifner |
| 2016/0157075 A1* | 6/2016 | Ho .................... H04W 56/0015 |
| | | 455/404.1 |
| 2017/0300654 A1* | 10/2017 | Stein ...................... H01Q 21/24 |

\* cited by examiner

EMP-RESISTANT SATELLITE COMMUNICATIONS WITH SIGNAL REGENERATING SYSTEM AND METHOD

CROSS-REFERENCE TO RELATED APPLICATIONS

This application is a continuation-in-part of and claims priority in U.S. non-provisional application Ser. No. 16/704,651, filed Dec. 5, 2019, which claims priority in U.S. Provisional Patent Application No. 62/632,205, filed Feb. 19, 2019, claims priority in U.S. Provisional Patent Application No. 63/192,410, filed May 24, 2021, is related to U.S. Pat. No. 9,026,106, issued May 5, 2015, and is related to U.S. Pat. No. 9,648,568, issued May 9, 2017, all of which are incorporated herein by reference.

BACKGROUND OF THE INVENTION

1. Field of the Invention

The present invention generally relates to signal transmitting and processing, and more particularly to shielding communications from the effects of electromagnetic pulses (EMPs) with a system and method utilizing a Faraday cage for very small aperture terminal (VSAT), C-band small aperture terminal (CSAT) applications and phased array antennas. The present invention also relates to signal regeneration for eliminating the effects of signal degradation.

2. Description of the Related Art

Electromagnetic pulses (EMPs) can occur naturally with solar flares, lightning and other natural phenomena. They can be artificially induced with electrical devices producing radio frequency (RF) signals. EMPs can be used for deliberately jamming RF signals, and thereby disrupting communications. For example, transmitting high-power RF signals on target carrier frequencies can interfere with data transmissions on those frequencies. Such techniques can be used against adversaries for exploiting vulnerabilities in their communication infrastructures. Effectively shielding telecommunication systems from EMP threats can significantly reduce such vulnerabilities.

The EMP Commission, appointed by the U.S. government, reported to Congress that satellite communications networks could be vulnerable to EMP attack. Based on the pervasiveness of satellite communications throughout commerce, defense, education, entertainment and other applications, such attacks could have devastating economic, national security and public safety consequences. For example, credit and debit card transactions are commonly process using satellite transmissions. Telephone communications also rely heavily on satellite transmissions. The worldwide network (Internet) could also be vulnerable to EMP attacks.

Electronic signal systems are well known and transmit from transmitters to receivers over various media, including land lines, fiber optic cables and wirelessly over the airwaves. Communications systems commonly use satellites for relaying signal transmissions. In the United States, the bandwidths for such communications are controlled and allocated by the Federal Communications Commission (FCC). For example, microwave frequencies range from $10^9$ Hz (1 GHz) to 1000 GHz.

Signals can be transmitted in either digital or analog formats. Digital-to-analog (D/A), analog-to-digital (A/D) or digital-digital (D/D) conversions are commonly accomplished with various electronic devices using hardware, firmware and software components and routines. Applications of the invention include and are not limited to medical devices, microwave, television, audio, hearing aids, data transmission or laser transmissions.

Signal degradation and interference in the form of "noise" can compromise signal system performance and bandwidth modulation efficiency. Currently, degradation of satellite signals is primarily caused by weather anomalies, such as precipitation. Other causes include atmospheric dust, smog, smoke, solar storms and solar flares. Moreover, a growing debris field from destroyed satellites and space missions orbits the earth and increasingly degrades satellite signals. Metallic particles in the debris field are particularly problematic because they reflect satellite signal transmissions. As the volume of debris in orbit increases, e.g., from satellite collisions, a cascading interference effect results, which is known as the "Kessler Effect."

Heretofore there has not been available an EMP-resistant satellite telecommunications system and method with a signal regenerating subsystem with the advantages and features of the present invention. The system utilizes software, firmware and/or hardware, which can be embedded or loaded on binary (digital) or quantum computers. The method of the present invention eliminates the effects of operating conditions, thereby regenerating signals. Signal-to-noise (S/N) and carrier noise (C/N) ratios can thus be improved.

SUMMARY OF THE INVENTION

The present invention provides an EMP-resistant telecommunications (telecom) system with a Faraday cage enclosing a core component subsystem. The telecom system can be combined with a regenerating system, which can be implemented with software, firmware or hardware. Analog signals can be converted to a digital format and put on a carrier signal for transmission. Digital signals can be put directly on a carrier signal for transmission. The combined content and carrier signals can be transmitted through various media. At or near the end of the communications link the digital signals may or may not be accessible at an intermediate frequency link (IFL). Accumulated noise is removed, whereby the signal is regenerated, thereby increasing the S/N and C/N ratios, providing more efficient bandwidth modulation, allowing more data throughput or the use of lower bandwidth at the same data rate.

The method of the present invention eliminates the effects of operating conditions, thereby regenerating signals. The present invention also provides methods for combining EMP resistance and signal regeneration functions in telecom systems.

Various objects and advantages of the present invention will become apparent from the following description taken in conjunction with the accompanying drawings wherein are set forth, by way of illustration and example, certain embodiments of this invention.

DETAILED DESCRIPTION OF THE PREFERRED EMBODIMENTS

I. Introduction and Environment

As required, detailed aspects of the present invention are disclosed herein, however, it is to be understood that the disclosed aspects are merely exemplary of the invention, which may be embodied in various forms. Therefore, specific structural and functional details disclosed herein are not to be interpreted as limiting, but merely as a basis for the claims and as a representative basis for teaching one skilled in the art how to variously employ the present invention in virtually any appropriately detailed structure.

Certain terminology will be used in the following description for convenience in reference only and will not be limiting. Said terminology will include the words specifically mentioned, derivatives thereof and words of similar meaning.

II. EMP-Resistant Telecommunications (Telecom) System 2

Figure 1:
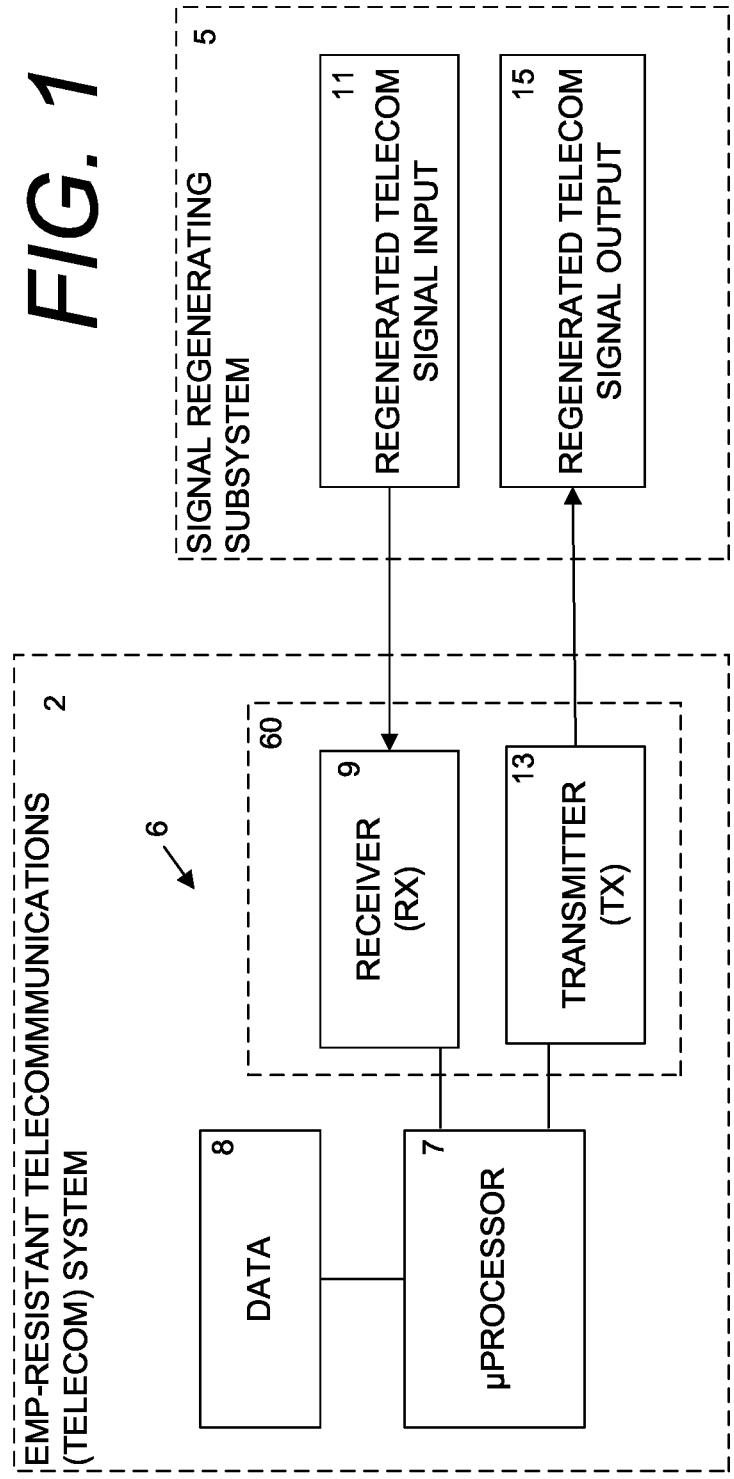
FIG. 1 is a schematic, block diagram of an EMP-resistant satellite telecommunications system with an optional signal regenerating subsystem embodying an aspect of the present invention.

Referring to the drawings in more detail, FIG. 1 shows an EMP-resistant telecommunications (telecom) system 2, including a Faraday cage 4 enclosing and shielding a core component subsystem 6, which includes a microprocessor 7 connected to a data storage component 8. An optional signal regenerating subsystem 5 can be connected to the telecom system 2. The microprocessor 7 is configured for receiving signals from a receiver 9, which receives input in the form of regenerated telecom signal input 11 from the signal regenerating subsystem 5. Output from the microprocessor 7 is received by a transmitter 13 for output to a regenerated telecom signal output 15 of the signal regenerating subsystem 5. The Faraday cage 4 is scalable and can comprise an entire building, a room or an equipment enclosure. The core component subsystem 6 includes a data source or storage component 8 configured for receiving input from and providing output to other components.

Figure 2:
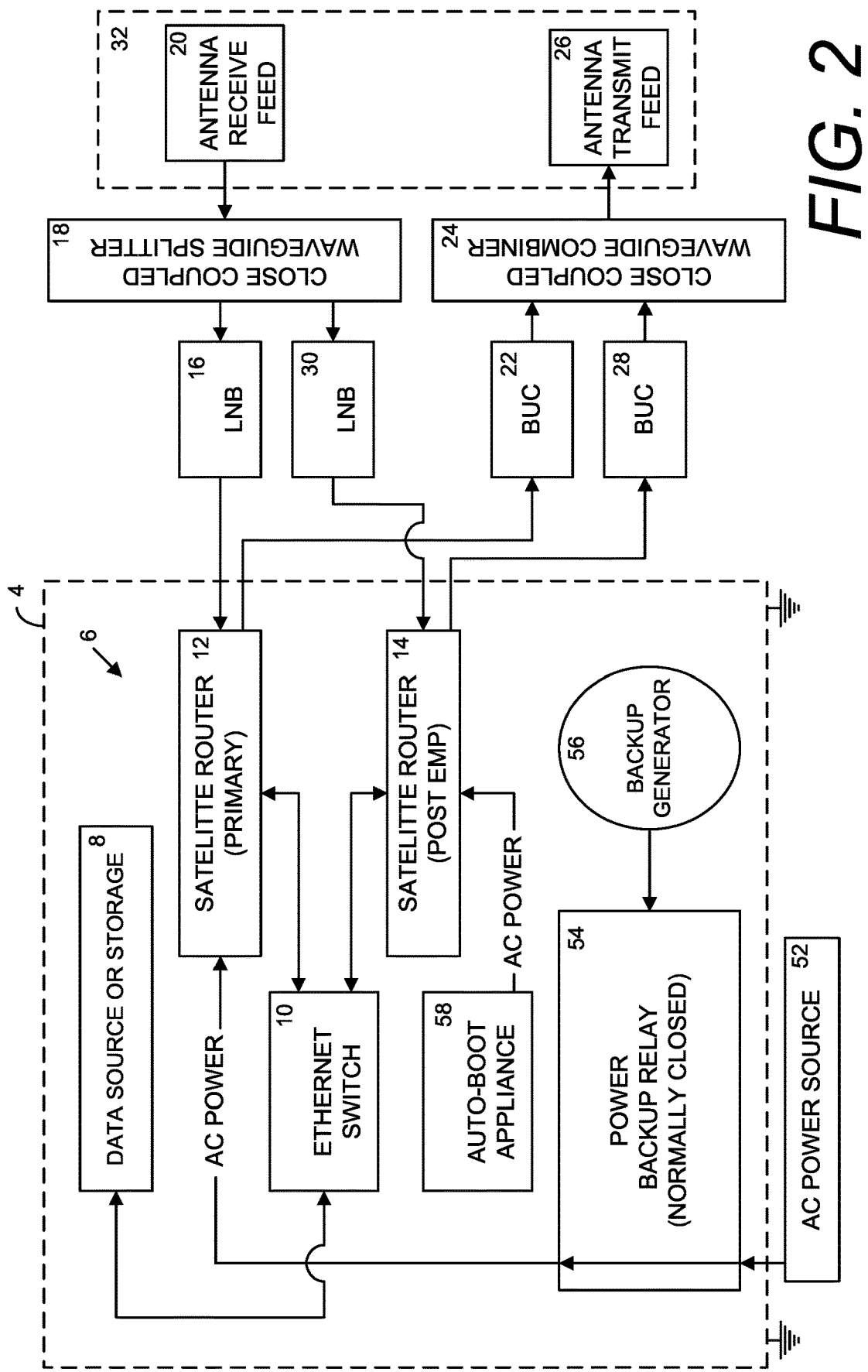
FIG. 2 is a schematic, block diagram showing the EMP-resistant telecommunications system. .

As shown in FIG. 2, an AC power source 52 is connected to the core component subsystem 6 via a power backup relay 54, which is normally closed. A backup generator 56 is connected to the power backup relay 54. An auto-boot appliance 58 provides AC power to a post-EMP satellite router 14 and the ethernet switch 10. AC power is also provided to the primary satellite router 12. The system 2 can include various other equipment and components for telecom service.

The ethernet switch 10 provides output to and receives input from a primary satellite router 12 and a post-EMP satellite router 14. Alternatively, the system 2 can accommodate receive-only satellite communication installations. The primary satellite router 12 is connected to a primary low noise block (LNB) converter 16, which in turn is connected to a close-coupled waveguide splitter 18 providing an antenna receive feed 20. The primary satellite router 12 is also connected to a primary block upconverter (BUC) 22, which in turn is connected to a close-coupled waveguide combiner 24 providing an antenna transmit feed 26.

The output of the post-EMP satellite router 14 is input to a BUC 28, which is connected to the close-coupled waveguide combiner 24 providing the antenna transmit feed 26. The post EMP satellite router 14 is also connected to a post EMP LNB converter 30, which in turn is connected to the close-coupled waveguide splitter 18 providing the antenna receive feed 20.

A dual antennae subsystem 32 (e.g., receive and transmit, or phased array) can be connected to the LNBs 16, 30 and the BUCs 22, 28 at the antenna feeding the two port microwave splitters and combiners 18, 24. In the phased array configuration, all LNB and BUC functions are contained within the phased array antenna. As such, the complete combination of elements will be installed and unpowered but connected to the other components of the system as detailed. A Faraday cage can be placed around other components of the system 2, e.g., equipment connected to the antennae(s) and the backup generator or alternator 56.

Alternatively, the antennae subsystem 32 can include antenna elements with various configurations, such as uni-directional dish and omni-directional (broadcast) antennae. Moreover, the antennae subsystem and the antenna elements thereof can be mounted on bases with articulated, variable-orientation mechanisms configured for optimizing transmission and reception.

The Faraday cage 4 for antenna-mounted electronics is grounded to the satellite antenna but preferably isolated from the antenna, e.g., with fiber gaskets or other insulating elements. Nylon or Teflon bolts and nuts can connect the isolated components to the antenna feeds or waveguide while a copper ground strap can connect a mesh Faraday cage 4 to the antennae. The mesh Faraday cage 4 can be contained within a standard fiberglass feed cover or within hub-mounted electronics. In either case, the result is a fully functional feed system of electronics (core component subsystem 6) within the grounded Faraday cage 4.

Inter-facility (IFL) cables between the antennae and the inside electronics/core components can be interconnected with either: double shielded wiring with the outside shield grounded at both ends; or with fiber optic cable with the optic transceivers located within the feed Faraday cage 4. In the event of the use of double-shielded IFL cables, power to the feed is supplied through the coaxial cable. Fiber optic IFL cables can utilize localized shielded batteries or shielded, dedicated generators.

Transmit and receive package equipment 60, including electronics and antenna mounted equipment, can be non-powered (OFF). At such time that an EMP event renders commercial power inoperative or in the event of a local power outage, the backup power energizes and the internal power relay switches power output to the backup redundant electronics. When the commercial power is restored, power will resume to the primary equipment package. This latter feature is primarily intended to restore signals in the event of a non-EMP event or condition. Following an EMP event, all components should be checked to determine which components have failed in order to be replaced for future EMPs.

By way of non-limiting example, the Hybrid Dual-Band Satellite Communication System disclosed in U.S. Pat. No. 9,648,568, which is assigned to a common assignee herewith and is incorporated herein by reference, could be EMP-protected with technology disclosed in the present application, e.g., Faraday cages.

A signal processing system includes hardware, firmware and/or software configured for converting (e.g., analog-digital (A/D), digital-analog (D/A or digital-digital (D/D))

signals at transmission and/or reception. The converted signals are processed to eliminate the effects of degradation, interference and noise. A signal processing method includes the steps of converting input signals, transmitting the converted signals and further processing to enable greater signal-to-noise ratios and carrier-to-noise ratios for greater signal integrity and data rates with less bandwidth.

III. Signal Regenerating System and Method

Figure 3:
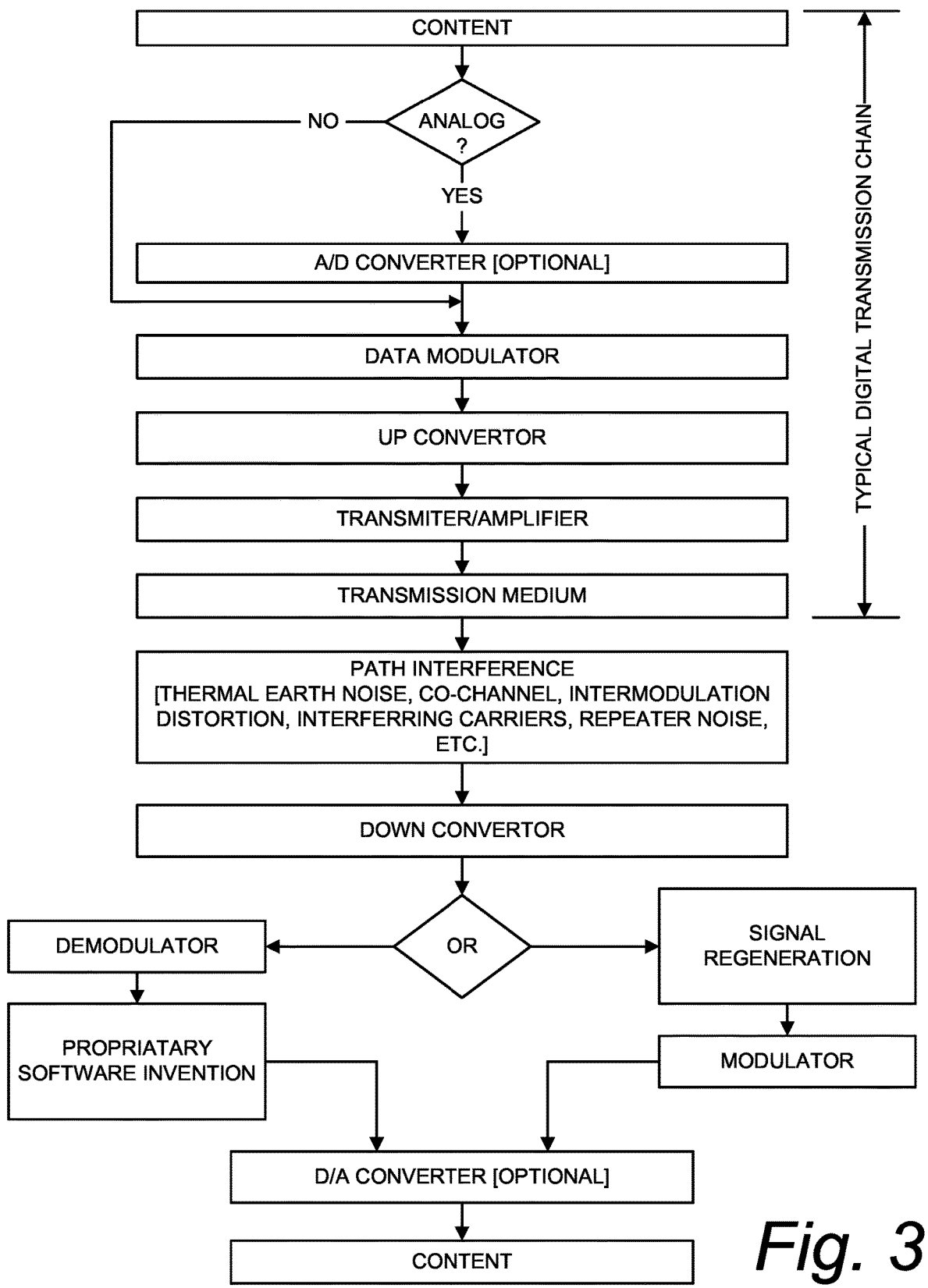
FIG. 3 is a flowchart showing the operation of the EMP-resistant communications system with an optional signal regeneration procedure.
Figure 4:
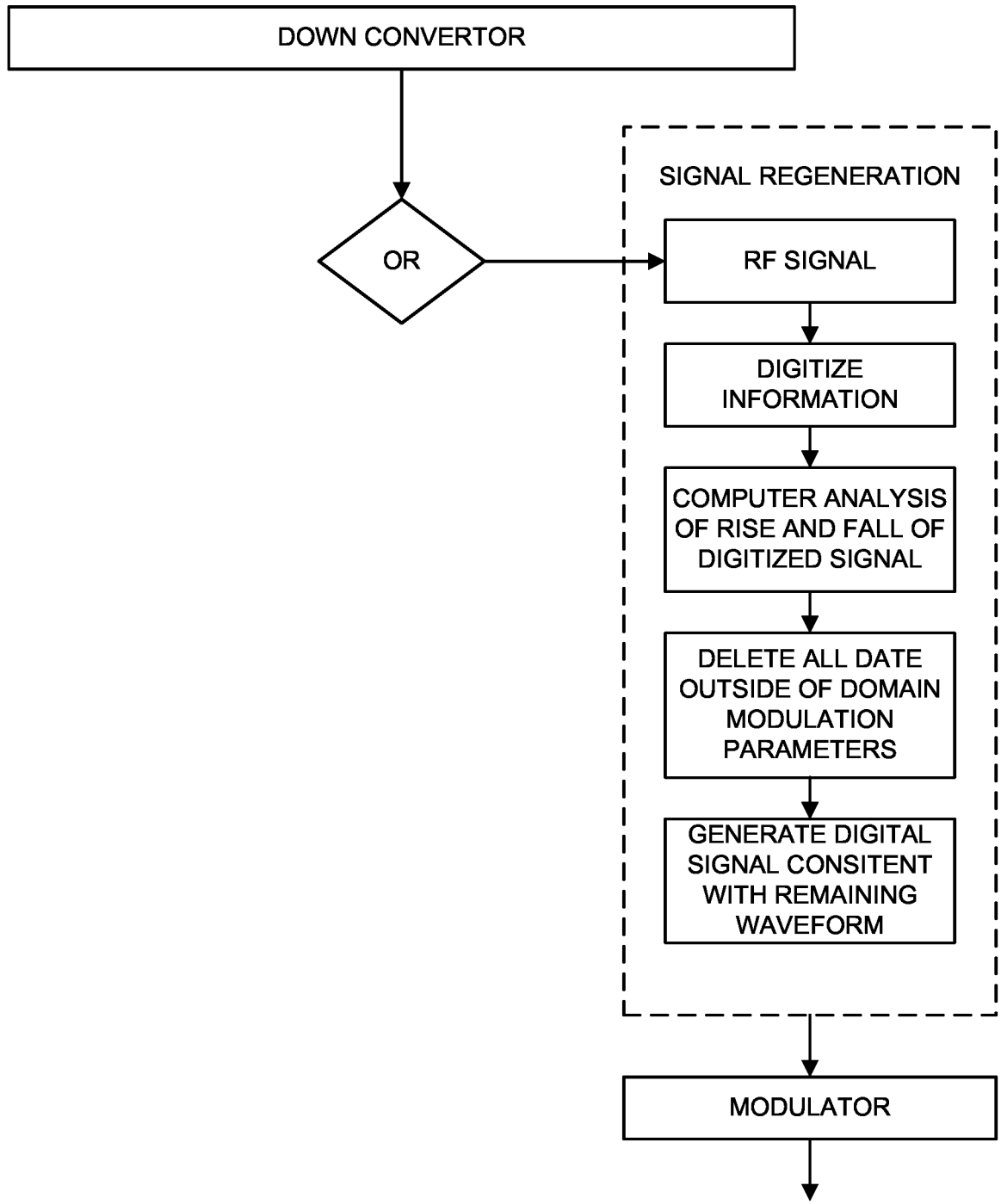
FIG. 4 is a flowchart showing in more detail aspects of the operation of the signal regenerating subsystem.

FIG. 3 shows the operation of the signal regenerating subsystem 5 embodying an aspect of the present invention. FIG. 4 shows in more detail the operation of the signal regenerating subsystem 5.

IV. Conclusion

It is to be understood that while certain embodiments and/or aspects of the invention have been shown and described, the invention is not limited thereto and encompasses various other embodiments and aspects.

Having thus described the invention, what is claimed as new and desired to be secured by Letters Patent is:

1. An electromagnetic pulse (EMP) resistant telecommunications (telecom) system, which comprises:
    a core component subsystem including a data source with a data storage component;
    a primary satellite router;
    a post-EMP satellite router;
    an ethernet switch configured for directing signals from said data source to one of said primary and post-EMP satellite routers;
    a Faraday cage enclosing said core component subsystem and configured for resisting EMP interference;
    an antenna subsystem connected to said satellite routers;
    said antenna subsystem including an antenna receive feed and an antenna transmit feed;
    said satellite routers connected to said antenna feeds;
    said antennae subsystem including one or more antenna elements with configurations chosen from the group comprising: parabolic dish; array; unidirectional; and omnidirectional; and
    a signal regenerating subsystem configured for eliminating path interference effects on transmitted and received signals.

2. The telecommunications system according to claim 1, which includes:
    an antenna variable-orientation mechanism configured for optimizing signal transmission and reception by directionally orienting one or more of said antenna elements.

3. The telecommunications system according to claim 1, which includes:
    a backup generator selectively connected to said core component subsystem.

4. The telecommunications system according to claim 1, which includes:
    a primary low noise block (LNB) connected to said primary satellite router and said antenna subsystem;
    a post-EMP LNB connected to said primary satellite router and said antenna subsystem; and
    a close coupled waveguide splitter connected to said LNBs and said antenna receive feed.

5. The telecommunications system according to claim 1, which includes:
    a primary block upconverter (BUC) connected to said primary satellite router and said antenna subsystem; and
    a post-EMP BUC connected to said post-EMP satellite router and said antenna subsystem.

6. The telecommunications system according to claim 1, which includes:
    said core component subsystem including a power backup relay selectively connected to said satellite routers.

7. The telecommunications system according to claim 6, which includes:
    said backup generator connected to said power backup relay and configured for providing AC power to said telecommunications system in the event of a power outage.

8. An electromagnetic pulse (EMP) resistant telecommunications system, which comprises:
    a core component subsystem including a data source with a data storage component;
    a primary satellite router;
    a post-EMP satellite router;
    an ethernet switch configured for directing signals from said data source to one of said primary and post-EMP satellite routers;
    a Faraday cage enclosing said core component subsystem and configured for resisting EMP interference;
    a backup generator selectively connected to said core component subsystem;
    an antenna subsystem connected to said satellite routers;
    said antenna subsystem including one or more antenna elements with configurations chosen from the group comprising: parabolic dish; array; unidirectional; and omnidirectional.
    said antenna subsystem including an antenna receive feed and an antenna transmit feed;
    said satellite routers connected to said antenna feeds;
    a primary low noise block (LNB) connected to said primary satellite router and said antenna subsystem;
    a post-EMP LNB connected to said primary satellite router and said antenna subsystem;
    a primary block upconverter (BUC) connected to said primary satellite router and said antenna subsystem;
    a post-EMP BUC connected to said post-EMP satellite router and said antenna subsystem; and
    a signal regenerating subsystem configured for eliminating path interference effects on transmitted and received signals.

9. The telecommunications system according to claim 7, which includes:
    a close coupled waveguide combiner connected to said BUCs and said antenna transmit feed.

10. The telecommunications system according to claim 7, which includes:
    said core component subsystem including a power backup relay selectively connected to said satellite routers.

11. The telecommunications system according to claim 7, which includes:
    a backup generator connected to said power backup relay and configured for providing AC power to said telecommunications system in the event of a power outage.

* * * * *